United States Patent
Kato

(10) Patent No.: US 8,705,247 B2
(45) Date of Patent: Apr. 22, 2014

(54) CIRCUIT BOARD AND MOTHER LAMINATED BODY

(75) Inventor: Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/232,135

(22) Filed: Sep. 14, 2011

(65) Prior Publication Data

US 2012/0002380 A1    Jan. 5, 2012

Related U.S. Application Data

(63) Continuation of application No. PCT/JP2010/051487, filed on Feb. 3, 2010.

(30) Foreign Application Priority Data

Mar. 19, 2009 (JP) ................................. 2009-068134

(51) Int. Cl.
*H05K 1/18* (2006.01)

(52) U.S. Cl.
USPC ........... 361/763; 361/749; 361/761; 174/254; 174/257

(58) Field of Classification Search
USPC .......... 361/748–751, 760–766; 174/254, 255, 174/257, 260–262
See application file for complete search history.

(56) References Cited

U.S. PATENT DOCUMENTS

| | | | |
|---|---|---|---|
| 5,004,639 A * | 4/1991 | Desai ............................ | 428/138 |
| 6,038,133 A | 3/2000 | Nakatani et al. | |
| 6,338,767 B1 | 1/2002 | Nakatani et al. | |
| 6,353,189 B1 | 3/2002 | Shimada et al. | |
| 6,750,669 B2 * | 6/2004 | Holcombe ............... | 324/756.04 |
| 6,831,357 B2 | 12/2004 | Nishitani et al. | |
| 7,936,567 B2 * | 5/2011 | Takashima et al. ........... | 361/761 |
| 8,148,645 B2 * | 4/2012 | Yoshikawa ..................... | 174/260 |
| 8,179,695 B2 * | 5/2012 | Jow et al. ...................... | 361/816 |
| 2002/0036054 A1 | 3/2002 | Nakatani et al. | |
| 2002/0074605 A1 * | 6/2002 | Gamand et al. ............... | 257/367 |

(Continued)

FOREIGN PATENT DOCUMENTS

| | | |
|---|---|---|
| CN | 1925721 A | 3/2007 |
| JP | 07-066313 A | 3/1995 |

(Continued)

OTHER PUBLICATIONS

Official Communication issued in International Patent Application No. PCT/JP2010/051487, mailed on May 18, 2010.

(Continued)

*Primary Examiner* — Hoa C Nguyen

(74) *Attorney, Agent, or Firm* — Keating & Bennett, LLP

(57) ABSTRACT

A circuit board includes a laminated body including insulation layers made of a flexible material that are stacked on one another. External electrodes are provided on a bottom surface of the laminated body. Ground conductors are provided in the laminated body and that are harder than the insulation layers. The laminated body includes a flexible region and a rigid region that is adjacent to the flexible region when viewed in plan from a z-axis direction. The rigid region is defined by the ground conductors when viewed in plan from the z-axis direction. The external electrodes are provided within the flexible region when viewed in plan from the z-axis direction.

11 Claims, 5 Drawing Sheets

(56) References Cited

U.S. PATENT DOCUMENTS

| | | |
|---|---|---|
| 2003/0219956 A1* | 11/2003 | Mori et al. .................... 438/393 |
| 2004/0088416 A1 | 5/2004 | Nakatani et al. |
| 2004/0231885 A1* | 11/2004 | Borland et al. ............... 174/260 |
| 2005/0082087 A1* | 4/2005 | Geva et al. ................... 174/255 |
| 2006/0079609 A1 | 4/2006 | Nishioka et al. |
| 2006/0102384 A1 | 5/2006 | Watanabe et al. |
| 2006/0200977 A1* | 9/2006 | Lauffer et al. ................... 29/830 |
| 2007/0064375 A1* | 3/2007 | Urashima et al. ............. 361/311 |
| 2007/0085108 A1 | 4/2007 | White et al. |
| 2009/0008795 A1* | 1/2009 | Honer et al. .................. 257/777 |
| 2009/0213565 A1* | 8/2009 | Booth et al. .................. 361/818 |

FOREIGN PATENT DOCUMENTS

| | | |
|---|---|---|
| JP | 10-321760 A | 12/1998 |
| JP | 11-186807 A | 7/1999 |
| JP | 11-220262 A | 8/1999 |
| JP | 11-274363 A | 10/1999 |
| JP | 2000-353875 A | 12/2000 |
| JP | 2002-329812 A | 11/2002 |
| JP | 2003-133653 A | 5/2003 |
| JP | 2003-304065 A | 10/2003 |
| JP | 2003-332496 A | 11/2003 |
| JP | 2005-036136 A | 2/2005 |
| JP | 2005-235808 A | 9/2005 |
| JP | 2006-013317 A | 1/2006 |
| JP | 2006-339186 A | 12/2006 |
| JP | 2007-250884 A | 9/2007 |
| WO | 98/47331 A1 | 10/1998 |
| WO | 2005/084090 A1 | 9/2005 |
| WO | 2006/046510 A1 | 5/2006 |

OTHER PUBLICATIONS

Official Communication issued in corresponding Japanese Patent Application No. 2011-504773, mailed on Nov. 13, 2012.

* cited by examiner

CIRCUIT BOARD AND MOTHER LAMINATED BODY

BACKGROUND OF THE INVENTION

1. Field of the Invention

The present invention relates to a circuit board and a mother laminated body, and more particularly, to a circuit board and a mother laminated body on which an electronic component is mounted.

2. Description of the Related Art

As an existing general circuit board, a hard multilayer board configured by including ceramic layers, epoxy resin layers, and other components that are stacked on one another is known (for example, refer to Japanese Unexamined Patent Application Publication No. 7-66313 and Japanese Unexamined Patent Application Publication No. 11-220262). A multilayer board is mounted on a printed circuit board, which is a hard board. When a multilayer board is mounted, external electrodes of the multilayer board and external electrodes of the printed circuit board are fixed to each other by solder. Furthermore, on a multilayer board, surface mount devices, such as a coil and a capacitor, are mounted. Such a multilayer board is, for example, used in an electronic apparatus, such as a mobile phone.

Existing multilayer boards have a problem in that the existing multilayer boards may be detached from printed circuit boards. More specifically, there is a case in which a printed circuit board is deformed due to impact caused when an electronic apparatus falls or is dropped. At this time, a multilayer board cannot sufficiently deform in accordance with the deformation of the printed circuit board since the multilayer board is a hard board. Therefore, a load is applied to the solder that fixes external electrodes of the printed circuit board and external electrodes of the multilayer board to each other. As a result, the solder may be broken and the multilayer board may be detached from the printed circuit board.

SUMMARY OF THE INVENTION

To overcome the problems described above, preferred embodiments of the present invention provide a circuit board to be mounted on a printed circuit board and a mother laminated body, the circuit board preventing detachment thereof from the printed circuit board even if the printed circuit board is deformed.

A circuit board according to a preferred embodiment of the present invention preferably includes a laminated body including insulation layers that are made of a flexible material that are stacked on one another, a plurality of external electrodes provided on a bottom surface of the laminated body, and a hard member that is provided in or on the laminated body and that is harder than the insulation layers. The laminated body preferably includes a first flexible region and a rigid region that is adjacent to the first flexible region when viewed in plan from a stacking direction. When viewed in plan from the stacking direction, preferably, a ratio of a hard member that occupies the rigid region to the rigid region is greater than a ratio of a hard member that occupies the first flexible region to the first flexible region. At least some of the plurality of external electrodes are provided within the first flexible region when viewed in plan from the stacking direction.

A mother laminated body according to another preferred embodiment of the present invention preferably includes the plurality of circuit boards arranged in a matrix and a reinforcing conductor arranged so as to surround the plurality of circuit boards arranged in a matrix when viewed in plan from a stacking direction.

According to various preferred embodiments of the present invention, even if a printed circuit board is deformed, detachment of a circuit board from the printed circuit board is effectively prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A circuit board and a mother laminated body according to preferred embodiments of the present invention will be described with reference to the drawings.

Figure 1:
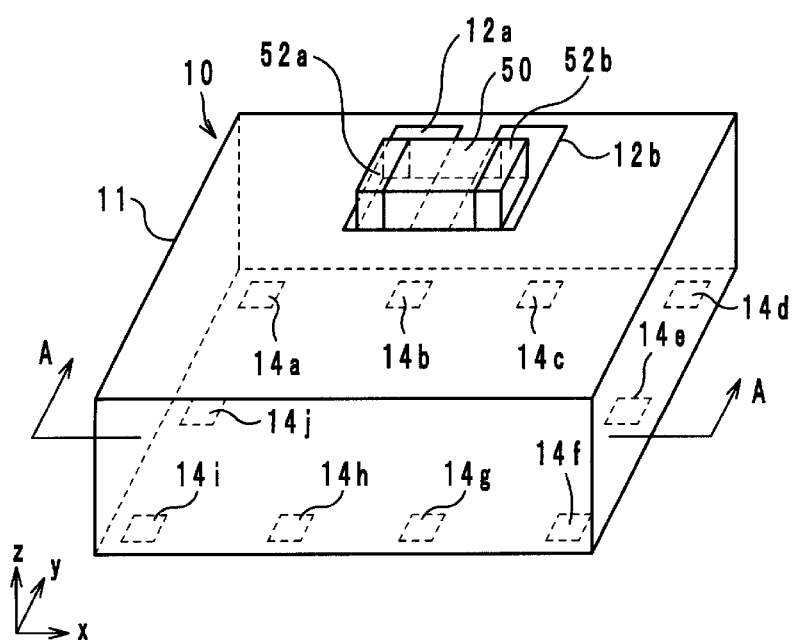
FIG. 1 is an external perspective view of a circuit board according to a preferred embodiment of the present invention and an electronic component mounted thereon.
Figure 2:
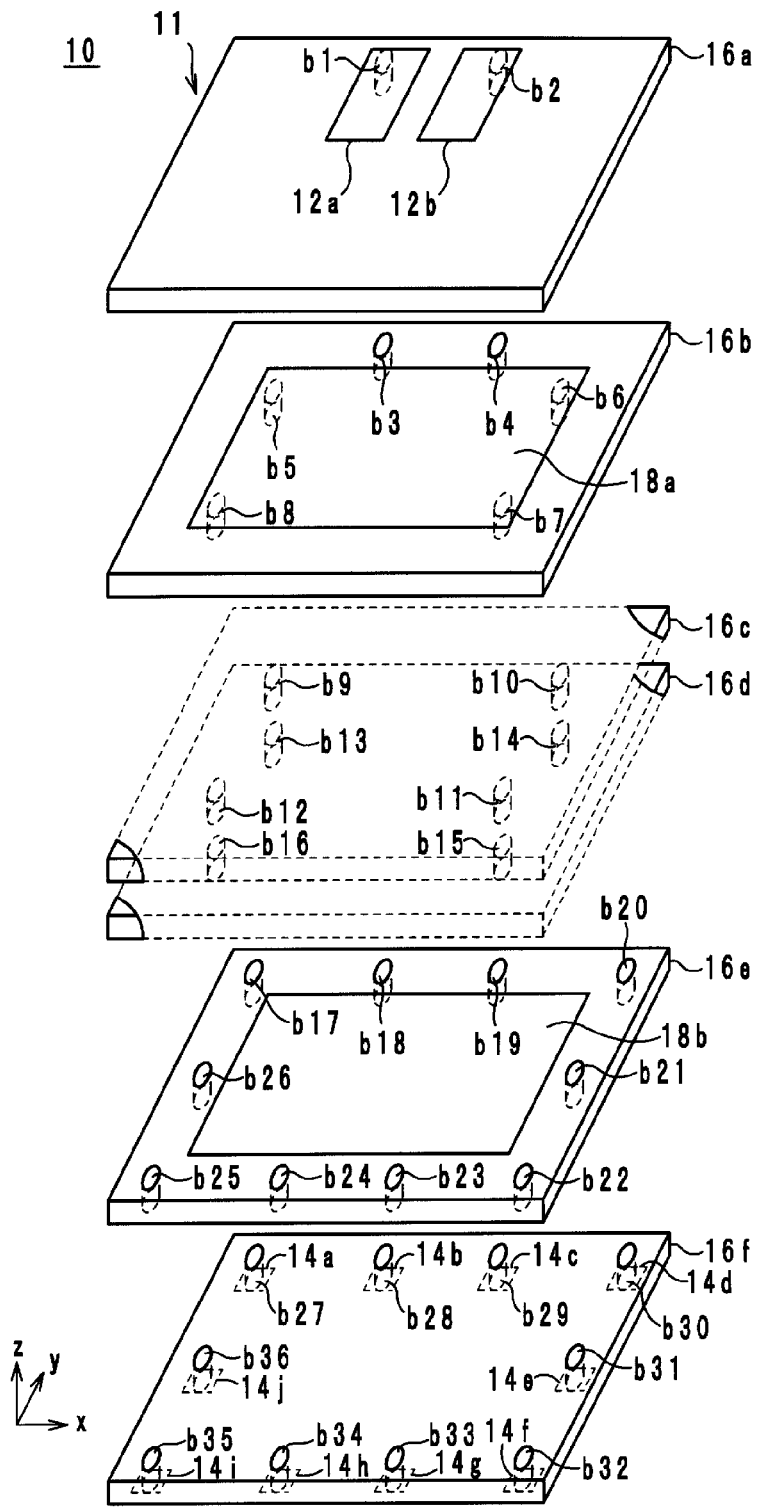
FIG. 2 is an exploded perspective view of the circuit board illustrated in FIG. 1.
Figure 3:
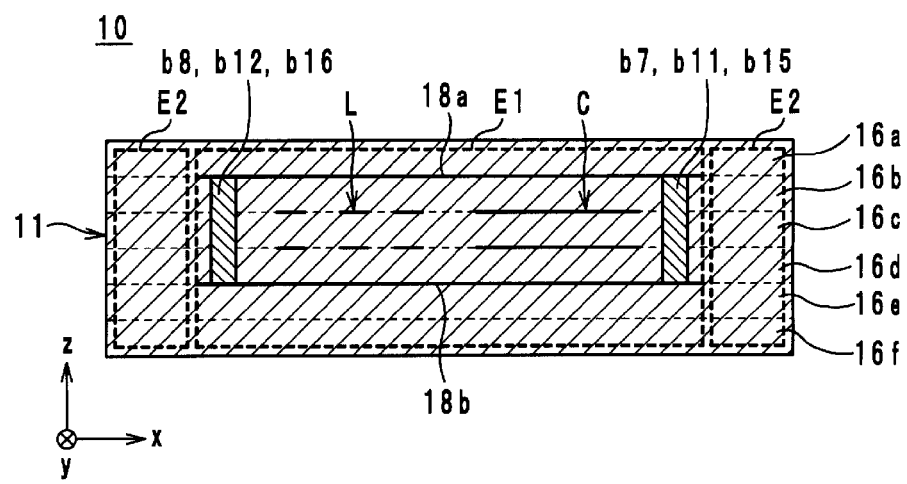
FIG. 3 is a sectional view of the circuit board illustrated in FIG. 1 taken along line A-A.
Figure 4:
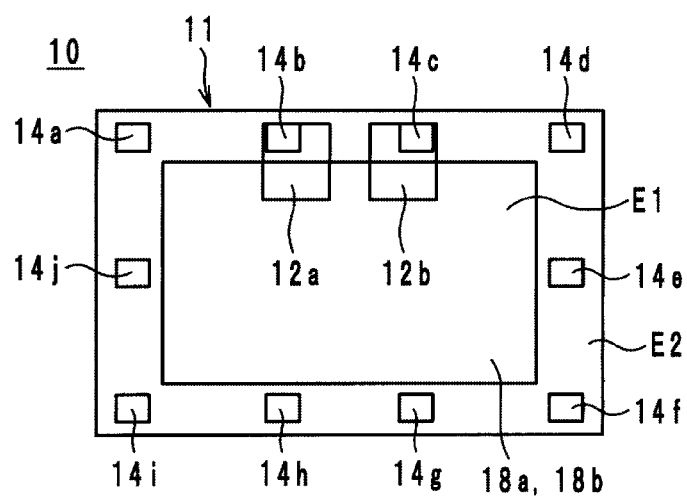
FIG. 4 is a perspective view of the circuit board illustrated in FIG. 1 viewed from a stacking direction.

The configuration of the circuit board according to preferred embodiments will be described hereinafter with reference to the drawings. FIG. 1 is an external perspective view of a circuit board 10 according to a preferred embodiment of the present invention and an electronic component 50 mounted thereon. FIG. 2 is an exploded perspective view of the circuit board 10 illustrated in FIG. 1. FIG. 3 is a sectional view of the circuit board 10 illustrated in FIG. 1 taken along line A-A. FIG. 4 is a perspective view of the circuit board 10 illustrated in FIG. 1 viewed from a stacking direction. In FIGS. 1 to 4, a direction in which insulation layers are stacked during formation of the circuit board 10 is defined as the stacking direction. The stacking direction is denoted as the z-axis direction, a direction along long sides of the circuit board 10 is denoted as the x-axis direction, and a direction along short sides of the circuit board 10 is denoted as y-axis direction. In addition, in the circuit board 10, a surface located on the positive side in the z-axis direction will be referred to as an upper surface, a surface located on the negative side in the z-axis direction will be referred to as a lower surface, and other surfaces will be referred to as side surfaces.

As illustrated in FIGS. 1 and 2, the circuit board 10 preferably includes a laminated body 11, external electrodes 12a and 12b and 14a to 14j, ground conductors 18a and 18b, and via-hole conductors b1 to b36. As illustrated in FIG. 2, the laminated body 11 preferably includes substantially rectangular insulation layers 16a to 16f that are preferably made of a flexible material, for example, a thermoplastic resin, such as a liquid crystal polymer, and that are stacked on one another. A top surface of insulation layers 16 will be referred to as a main surface on the positive side in the z-axis direction, and a bottom surface of the insulation layers 16 will be referred to as a main surface on the negative side in the z-axis direction.

The ground conductors 18a and 18b are preferably solid electrodes, i.e., film electrodes, made of a conductive material, for example, metal leaf, such as copper leaf, having a relatively large area, and are hard members that are harder than the insulation layers 16. "Harder" means that the Young's modulus is large. The Young's modulus of the ground conductors is preferably about 100 GPa, for example, and the Young's modulus of the insulation layers 16 is preferably about 2 GPa to about 10 GPa, for example. The ground conductors 18a and 18b are provided in the laminated body 11 and the ground potential is applied thereto. More specifically, the ground conductor 18a is, as illustrated in FIG. 2, provided on a surface of the insulation layer 16b and preferably has a rectangular or substantially rectangular shape when viewed in plan from the z-axis direction. The ground conductor 18b is, as illustrated in FIG. 2, provided on a surface of the insulation layer 16e and preferably has a rectangular or substantially rectangular shape when viewed in plan from the z-axis direction. In this preferred embodiment, the ground conductors 18a and 18b overlap one another when viewed in plan from the z-axis direction.

As illustrated in FIGS. 3 and 4, the circuit board 10 preferably has a rigid region E1 and a flexible region E2 that are adjacent to each other when viewed in plan from the z-axis direction. In the rigid region E1, the ground conductors 18a and 18b, which are harder than the insulation layers 16, are provided. On the other hand, in the flexible region E2, the ground conductors 18a and 18b are not provided. Therefore, the rigid region E1 has a structure that is not easily deformed or bent as compared to that of the flexible region E2. It is to be noted that, in this preferred embodiment, the rigid region E1 preferably has the same or substantially the same shape as the ground conductors 18a and 18b when viewed in plan from the z-axis direction. That is, the rigid region E1 is defined by the ground conductors 18a and 18b when viewed in plan from the z-axis direction. Furthermore, the flexible region E2 is preferably so as to surround the rigid region E1, when viewed in plan from the z-axis direction.

The external electrodes 12 are preferably layers made of a conductive material, for example, metal leaf, such as copper leaf, and, as illustrated in FIG. 1, provided on the upper surface of the laminated body 11. That is, the external electrodes 12 are provided on a top surface of the insulation layer 16a, which is provided on the most positive side in the z-axis direction. Furthermore, as illustrated in FIG. 4, portions of the external electrodes 12 are preferably arranged so as to overlap the rigid region E1 when viewed in plan from the z-axis direction.

The external electrodes 14 are preferably layers made of a conductive material, for example, metal leaf, such as copper leaf, and, as illustrated in FIG. 1, provided on the lower surface of the laminated body 11. That is, the external electrodes 14 are provided on a bottom surface of the insulation layer 16f, which is provided on the most negative side in the z-axis direction. Furthermore, the external electrodes 14 are provided along the periphery of the bottom surface of the laminated body 11. Therefore, as illustrated in FIG. 4, all of the external electrodes 14 are located within the flexible region E2 when viewed in plan from the z-axis direction.

In addition, as illustrated in FIG. 3, the laminated body 11 preferably includes a coil L and a capacitor C. The coil L and the capacitor C are configured by inner conductors (omitted in FIG. 2) provided on surfaces of the insulation layers 16c and 16d illustrated in FIG. 2. Therefore, the coil L and the capacitor C are preferably located between the ground conductors 18a and 18b in the z-axis direction. Furthermore, as illustrated in FIG. 3, the coil L and the capacitor C do not protrude from the ground conductors 18a and 18b and overlap the ground conductors 18a and 18b when viewed in plan from the z-axis direction. That is, the coil L and the capacitor C are provided within the rigid region E1 when viewed in plan from the z-axis direction.

The via-hole conductors b1 to b36 are arranged so as to connect the external electrodes 12 and 14, the ground conductors 18, the coil L, and the capacitor C and penetrate the insulation layers 16 in the z-axis direction. More specifically, as illustrated in FIG. 2, the via-hole conductors b1 and b2 penetrate the insulation layer 16a in the flexible region E2 in the z-axis direction, and are connected to the external electrodes 12a and 12b.

As illustrated in FIG. 2, the via-hole conductors b3 and b4 penetrate the insulation layer 16b in the flexible region E2 in the z-axis direction. The via-hole conductors b3 and b4 are connected to the via-hole conductors b1 and b2, as well as to the coil L, the capacitor C, and other circuit elements (not illustrated in FIG. 2) provided on the insulation layers 16c and 16d. As illustrated in FIG. 2, the via-hole conductors b5 to b8 penetrate the insulation layer 16b in the rigid region E1 in the z-axis direction. The via-hole conductors b5 to b8 are connected to portions in the vicinity of four corners of the ground conductor 18a, respectively.

As illustrated in FIG. 2, the via-hole conductors b9 to b12 penetrate the insulation layer 16c in the rigid region E1 in the z-axis direction. The via-hole conductors b9 to b12 are connected to the via-hole conductors b5 to b8, respectively. It is to be noted that although the via-hole conductors b9 to b12 are preferably provided in the insulation layer 16c in FIG. 2, in practice, other via-hole conductors are also provided.

As illustrated in FIG. 2, the via-hole conductors b13 to b16 penetrate the insulation layer 16d in the rigid region E1 in the z-axis direction. The via-hole conductors b13 to b16 are connected to the via-hole conductors b9 to b12, respectively, as well as to portions in the vicinity of four corners of the ground conductor 18b. Therefore, the via-hole conductors b5 to b16 connect the ground conductor 18a and the ground conductor 18b at four locations. It is to be noted that although the via-hole conductors b13 to b16 are provided in the insulation layer 16d in FIG. 2, in practice, other via-hole conductors are also provided.

As illustrated in FIG. 2, the via-hole conductors b17 to b26 penetrate the insulation layer 16e in the flexible region E2 in the z-axis direction. The via-hole conductors b17 to b26 are connected to the coil L, the capacitor C, and other circuit elements (not illustrated in FIG. 2) provided on the insulation layers 16c and 16d.

As illustrated in FIG. 2, the via-hole conductors b27 to b36 penetrate the insulation layer 16f in the flexible region E2 in the z-axis direction. The via-hole conductors b27 to b36 are connected to the via-hole conductors b17 to b26, respectively, as well as to the external electrodes 14a to 14j, respectively.

By stacking the insulation layers 16a to 16f that are configured as described above, the circuit board 10 illustrated in FIG. 1 is obtained.

As illustrated in FIG. 1, the electronic component 50 is preferably an element, such as a coil or a capacitor, for example, mounted on the circuit board 10. The electronic component 50 includes external electrodes 52a and 52b. The external electrodes 52a and 52b are connected to the external electrodes 12a and 12b, respectively, by solder or other suitable material, for example. Since portions of the external electrodes 12a and 12b are provided so as to, as illustrated in FIG. 4, overlap the rigid region E1 when viewed in plan from the z-axis direction, the electronic component 50 is located within the rigid region E1 when viewed in plan from the z-axis direction.

As described above, the circuit board 10 on which the electronic component 50 is mounted is itself mounted on a printed circuit board, which is not illustrated. At this time, external electrodes on the printed circuit board side are fixed to the external electrodes 14 by solder, for example. Furthermore, the printed circuit board on which the circuit board 10 is preferably mounted is installed in, for example, an electronic apparatus such as a mobile phone.

A method for fabricating the circuit board 10 will be described hereinafter with reference to the drawings. First, insulation layers 16 are prepared and copper leaf is arranged on substantially the entirety of one main surface of each insulation layer 16. Here, in insulation layers 16a to 16e, the main surfaces on which the copper leaf is provided are referred to as top surfaces. On the other hand, in an insulation layer 16f, a main surface on which copper leaf is provided is referred to as a bottom surface.

Next, laser beams are radiated, from the bottom surface side, onto portions (refer to FIG. 2) of the insulation layers 16a to 16e in which the via-hole conductors b1 to b26 are to be formed, in order to form via holes. In addition, laser beams are radiated, from the top surface side, onto portions (refer to FIG. 2) of the insulation layer 16f in which the via-hole conductors b27 to b36 are to be formed, in order to form via holes.

Next, the external electrodes 12 illustrated in FIG. 2 are formed on the top surface of the insulation layer 16a preferably by a photolithography step, for example. More specifically, a resist having a shape corresponding to the external electrodes 12 illustrated in FIG. 2 is printed onto the copper leaf on the insulation layer 16a. An etching process is then performed on the copper leaf in order to remove copper foil in portions that are not coated by the resist. After that, the resist is removed. Thus, the external electrodes 12 illustrated in FIG. 2 are formed on the top surface of the insulation layer 16a.

Next, the ground conductor 18a illustrated in FIG. 2 is formed on the top surface of the insulation layer 16b preferably by a photolithography step, for example. In addition, preferably by a photolithography step, inner conductors (not illustrated in FIG. 2) that define the coil L and the capacitor C illustrated in FIG. 3 are formed on the top surfaces of the insulation layers 16c and 16d. In addition, preferably by a photolithography step, the ground conductor 18b illustrated in FIG. 2 is formed on the top surface of the insulation layer 16e. In addition, preferably by a photolithography step, the external electrodes 14 illustrated in FIG. 2 are formed on the bottom surface of the insulation layer 16f. It is to be noted that these photolithography steps are preferably the same or substantially the same as that for forming the external electrodes 12, description thereof is omitted.

Next, the via holes formed in the insulation layers 16a to 16f are filled with conductive paste preferably primarily including copper, for example, in order to form the via-hole conductors b1 to b36 illustrated in FIG. 2.

Next, the insulation layers 16a to 16f are stacked in this order. The insulation layers 16a to 16f are then attached to one another by applying force to the insulation layers 16a to 16f from the top and bottom directions in the stacking direction. Thus, the circuit board 10 illustrated in FIG. 1 is obtained.

Figure 5:
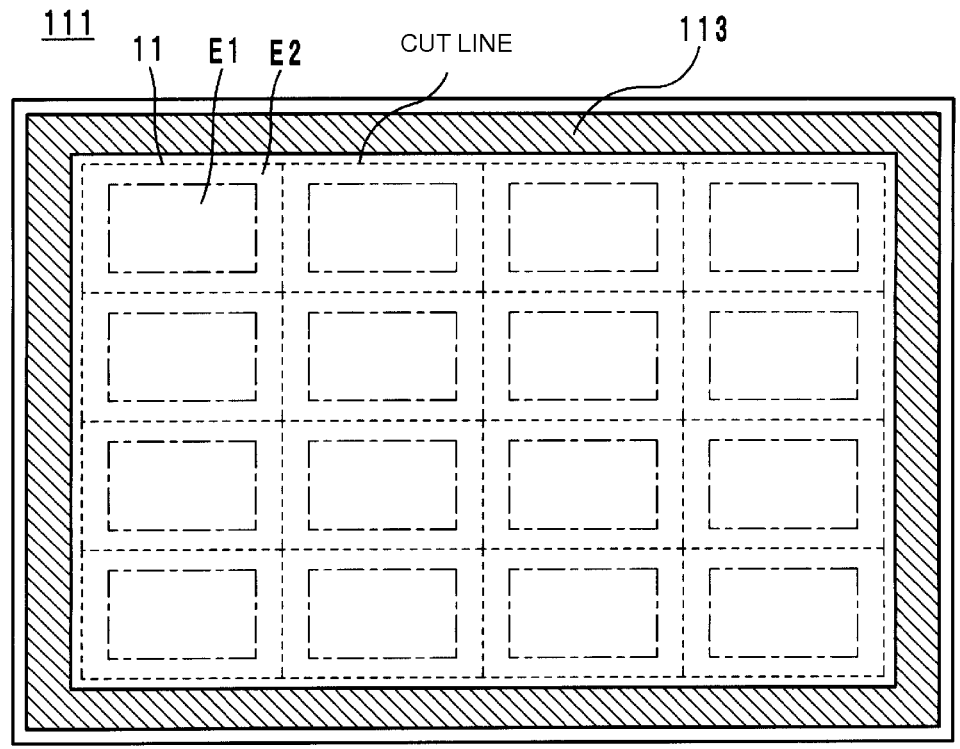
FIG. 5 is a diagram illustrating a mother laminated body viewed in plan from the stacking direction.

In the above-described fabrication method, a case in which a single circuit board 10 is fabricated has been described as an example. However, in practice, a mother laminated body is obtained by stacking large-sized insulation layers 16. The mother laminated body is then cut in order to simultaneously fabricate a plurality of circuit boards 10. FIG. 5 is a diagram illustrating a mother laminated body 111 viewed in plan from the stacking direction. In the mother laminated body 111, as illustrated in FIG. 5, flexible regions E2 of neighboring laminated bodies 11 are adjacent to one another. Therefore, when the mother laminated body 111 is transported, the mother laminated body 111 may be undesirably bent at the flexible regions E2. In view of this, the mother laminated body 111 illustrated in FIG. 5 preferably includes a reinforcing conductor (reinforcing member) 113 provided on a top surface thereof so as to surround a plurality of laminated bodies 11 that are arranged in a matrix when viewed in plan from the z-axis direction. Thus, bending of the mother laminated body 111 during transportation is effectively prevented. It is to be noted that a resist film, for example, may be used as an alternative reinforcing member to the reinforcing conductor 113.

With the circuit board 10, as described later, it is possible to prevent detachment of the circuit board 10 from the printed circuit board even if the printed circuit board is deformed. More specifically, the printed circuit board may be deformed due to impact caused when an electronic apparatus falls or is dropped. At this time, due to the deformation of the printed circuit board, a load is applied to solder that connects external electrodes of the printed circuit board and external electrodes of a multilayer board to each other. As a result, the solder may be broken and the multilayer board may be detached from the printed circuit board.

On the other hand, in the circuit board 10, the external electrodes 14 are preferably located within the flexible region E2 when viewed in plan from the z-axis direction. The flexible region E2 is preferably configured so as to be more easily deformed as compared to the rigid region E1. Therefore, even if the printed circuit board on which the circuit board 10 is mounted is deformed when an electronic apparatus in which the circuit board 10 is installed falls or is dropped, the circuit board 10 can deform at the flexible region E2 in accordance with the deformation of the printed circuit board. Therefore, it is possible to prevent the application of a load to the solder that connects the external electrodes of the printed circuit board and the external electrodes 14 of the circuit board 10 to each other. As a result, breakage of the solder and the resulting detachment of the circuit board 10 from the printed circuit board are prevented.

Furthermore, in the circuit board 10, the external electrodes 14 are preferably provided within the flexible region E2 and fixed to the external electrodes of the printed circuit board. Therefore, even if the positions of the external electrodes of the printed circuit board are changed due to deformation of the printed circuit board, the external electrodes 14 can confirm the change in the positions of the external electrodes of the printed circuit board by deformation of the flexible region E2. As a result, detachment of the circuit board 10 from the printed circuit board is prevented. In particular, in the circuit board 10, since all the external electrodes 14 are provided within the flexible region E2, detachment of the circuit board 10 from the printed circuit board is more effectively prevented.

In addition, in the circuit board 10, as described above, it is possible to prevent detachment of the circuit board from the printed circuit board by providing the flexible region E2, as well as to prevent the occurrence of a change in the characteristics of the circuit elements, such as the coil L and the capacitor C incorporated into the circuit board 10. More specifically, in order to prevent a circuit board from being detached from a printed circuit board, for example, substantially the entire circuit board may preferably be defined as a flexible region. Here, if substantially the entire of the circuit board is a flexible region, substantially the entire of the circuit board is able to deform. However, the circuit elements, such as a coil and a capacitor, are provided in the circuit board. Therefore, if substantially the entire of the circuit board deforms, the shapes of inner conductors that configure the coil, the capacitor, and other circuit elements and the distances between the inner conductors may be changed. As a result, the value of inductance of the coil or the capacitance of the capacitor may undesirably change.

In view of this, in the circuit board 10, the rigid region E1, which is not easily deformed as compared to the flexible region E2, is preferably provided. Therefore, when an external force is applied to the circuit board 10, the flexible region E2 deforms and the rigid region E1 does not significantly deforms. Here, as illustrated in FIG. 3, the circuit elements, such as the coil L and the capacitor C, preferably provided within the rigid region E1. Therefore, the circuit elements, such as the coil L and the capacitor C, do not significantly deform even if external force is applied to the circuit board 10. As a result, the occurrence of changes in the value of inductance of the coil L and the capacitance of the capacitor C is effectively prevented.

Furthermore, in the circuit board 10, the coil L and the capacitor C are preferably located between the ground conductors 18a and 18b in the z-axis direction, and overlap the ground conductors 18a and 18b when viewed in plan from the z-axis direction. That is, the coil L and the capacitor C are preferably provided within a region sandwiched between the ground conductors 18a and 18b. Therefore, in the circuit board 10, deformation of the coil L and the capacitor C is more effectively prevented than in a circuit board in which only one ground conductor is provided.

Furthermore, in the circuit board 10, the ground conductors 18a and 18b are preferably connected to each other by the via-hole conductors b5 to b16 at the four corners thereof. Therefore, the ground conductors 18a and 18b are fixed to each other at the four corners thereof. Accordingly, it is possible to prevent stretching and shrinking of the ground conductors 18a and 18b in the x-axis direction when the circuit board 10 is deformed, as well as to prevent stretching and shrinking of the ground conductors 18a and 18b in the y-axis direction. As a result, deformation of the rigid region E1 and changes in the characteristics of the circuit elements such as the coil L and the capacitor C are more effectively prevented.

It is to be noted that, in the circuit board 10, the ground conductors 18a and 18b are preferably fixed to each other by the via-hole conductors b5 to b16 at four positions. However, the number of positions at which the ground conductors 18a and 18b are fixed to each other is not limited to this. The ground conductors 18a and 18b may be connected to each other at least three positions that are not aligned in a line when viewed in plan from the z-axis direction. In doing so, it is possible to prevent stretching and shrinking of the ground conductors 18a and 18b in the x-axis direction and the y-axis direction.

In addition, in the circuit board 10, the ground conductors 18 provided in the circuit board 10 are preferably used to form the rigid region E1. Therefore, the circuit board can be fabricated at a lower cost than a circuit board to which a new configuration is added in order to form a rigid region. It is to be understood that the inner conductors used to form the rigid region E1 are not limited to the ground conductors 18. Therefore, capacitor conductors may be used as the inner conductors. In a case in which the capacitor conductors are used, the circuit board 10 can be fabricated at low cost.

In addition, in the circuit board 10, the electronic component 50 is preferably mounted within the rigid region E1. The rigid region E1 is not easily deformed as compared to the flexible region E2. Therefore, it is possible to prevent the application of a load to the solder that connects the external electrodes 12 and the external electrodes 52 to each other due to deformation of the circuit board 10. As a result, in the circuit board 10, detachment of the electronic component 50 from the circuit board 10 is effectively prevented.

Figure 6:
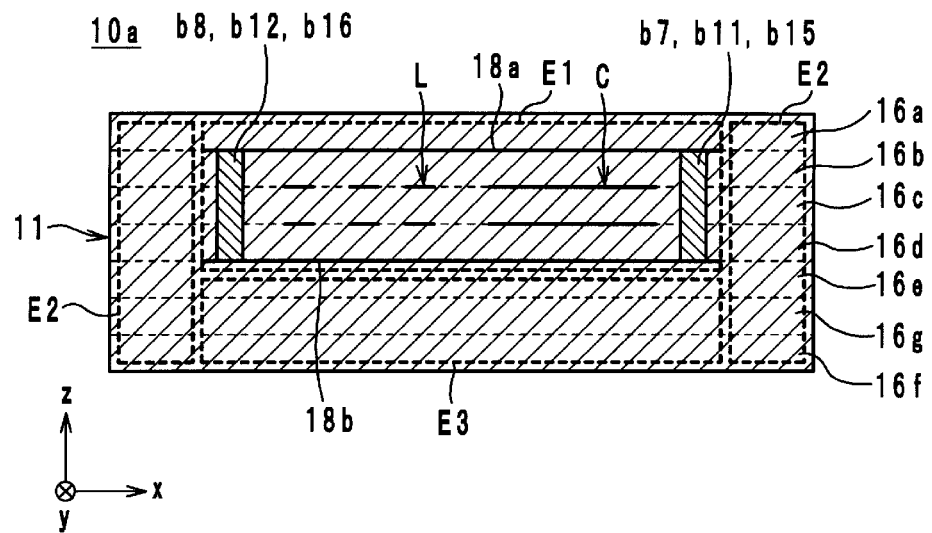
FIG. 6 is a sectional view of a circuit board according to a first modification of a preferred embodiment of the present invention.

A circuit board 10a according to a first modification of a preferred embodiment of the present invention will be described hereinafter with reference to the drawings. FIG. 6 is a sectional view of the circuit board 10a according to the first modification.

The circuit board 10a is different from the circuit board 10 in that the circuit board 10a preferably further includes a flexible region E3. As with the flexible region E2, the flexible region E3 is more easily deformed as compared to the rigid region E1. The flexible region E3 is located on the negative side of the rigid region E1 in the z-axis direction. Thus, by providing the flexible region E3 on the more negative side in the z-axis direction than the rigid region E1, substantially the entire bottom surface of the circuit board 10a defines the flexible regions E2 and E3. As a result, the circuit board 10a can deform along the entire bottom surface thereof. Therefore, detachment of the circuit board 10a from a printed circuit board is effectively prevented.

Figure 7:
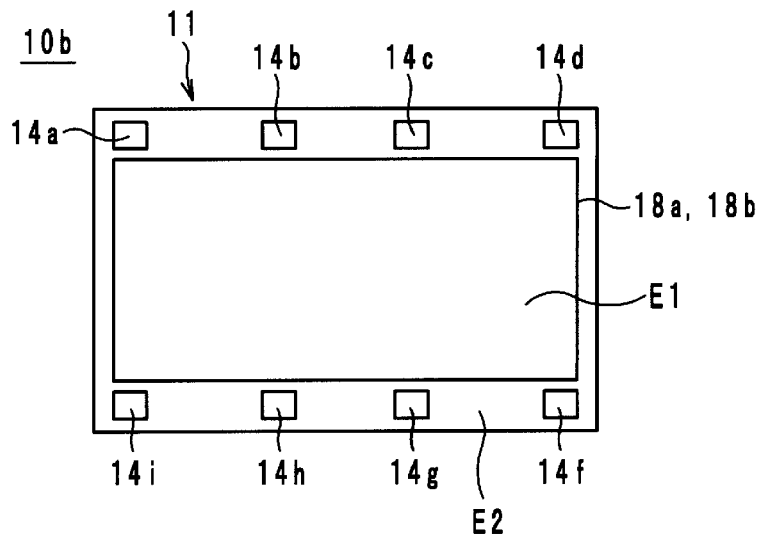
FIG. 7 is a perspective view of a circuit board according to a second modification of a preferred embodiment of the present invention viewed from the stacking direction.

A circuit board 10b according to a second modification of a preferred embodiment of the present invention will be described hereinafter with reference to the drawings. FIG. 7 is a perspective view of the circuit board 10b according to the second modification viewed from the stacking direction.

As illustrated in FIG. 7, the circuit board 10b is different from the circuit board 10 in that external electrodes 14 are preferably provided along long sides of a bottom surface thereof. When the external electrodes 14 are provided along the long sides of the bottom surface, the ground conductors 18a and 18b can be extended to portions close to short sides of the bottom surface in the x-axis direction. Therefore, in the circuit board 10b, the areas of the ground conductors 18a and 18b are greater than those in the circuit board 10, and accordingly, the area of the rigid region E1 defined by the ground conductors 18a and 18b is increased. Therefore, in the circuit board 10b, the number of circuit elements that can be incorporated into the circuit board 10b is greater than in the circuit board 10.

Figure 8:
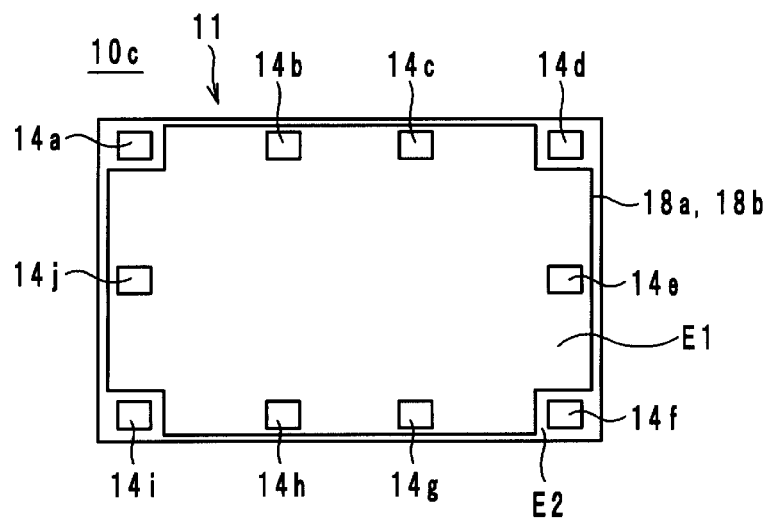
FIG. 8 is a diagram illustrating a circuit board according to a third modification of a preferred embodiment of the present invention viewed in plan from the stacking direction.

A circuit board 10c according to a third modification of a preferred embodiment of the present invention will be described hereinafter with reference to the drawings. FIG. 8 is a diagram illustrating the circuit board 10c according to the third modification viewed in plan from the stacking direction.

In the circuit board 10c, the ground conductors 18a and 18b preferably overlap external electrodes 14b, 14c, 14e, 14g, 14h, and 14j when viewed in plan from the z-axis direction. That is, the external electrodes 14b, 14c, 14e, 14g, 14h, and 14j are provided within the rigid region E1 defined by the ground conductors 18a and 18b when viewed in plan from the z-axis direction. On the other hand, external electrodes 14a, 14d, 14f, and 14i, which are located closest to corners of a bottom surface of the circuit board 10c, are preferably provided within the flexible region E2 when viewed in plan from the z-axis direction. As in the circuit board 10c, not all the external electrodes 14 need to be provided within the flexible region E2.

Furthermore, in the circuit board 10c, the external electrodes 14a, 14d, 14f, and 14i, to which loads are most likely to be applied when a printed circuit board is deformed, are provided within the flexible region E2 when viewed in plan from the z-axis direction. As a result, detachment of the circuit board 10c from the printed circuit board is effectively prevented.

A circuit board according to preferred embodiments of the present invention is not limited to the circuit boards 10 and 10a to 10c described above and may be modified within the scope of the present invention.

It is to be understood that although the rigid region E1 is preferably defined by the ground conductors 18a and 18b in the circuit boards 10 and 10a to 10c, the rigid region E1 may be defined by other configurations. Other configurations include, for example, resist films provided on the surfaces of the circuit boards 10 and 10a to 10c.

In addition, in the circuit boards 10 and 10a to 10c, the ground conductors 18 defined by solid electrodes are preferably provided within the rigid region E1 as hard members in order to allow the rigid region E1 to have a structure that is not easily deformed as compared to those of the flexible regions E2 and E3. However, the hard members to be provided within the rigid region E1 are not limited to the ground conductors 18, which are solid conductors. As the hard members, for example, capacitor conductors or circuit conductors may be used. However, if the hard members are circuit conductors, solid electrodes cannot be provided within the rigid region E1. Therefore, when viewed in plan from the z-axis direction, a region is preferably provided in the rigid region E1 in which hard members cannot be provided. In this case, a ratio of hard members that occupy the rigid region E1 to the rigid region E1 must be greater than a ratio of hard members that occupy the flexible regions E2 and E3 to the flexible regions E2 and E3, when viewed in plan from the z-axis direction. In doing so, the rigid region E1 is not easily deformed as compared to the flexible regions E2 and E3. It is to be noted that, if all of the hard members are made of the same material and have the same or substantially the same thickness, the ratio of hard members that occupy the rigid region E1 to the rigid region E1 refers to the ratio of an area occupied by the hard members in the rigid region E1 to the area of the rigid region E1, and the ratio of hard members that occupy the flexible regions E2 and E3 to the flexible regions E2 and E3 refers to the ratio of areas occupied by the hard members in the flexible regions E2 and E3 to the areas of the flexible regions E2 and E3.

It is to be noted that inner conductors may be provided within the flexible regions E2 and E3.

Preferred embodiments of the present invention are useful for circuit boards and mother laminated bodies and, more particularly, preferred embodiments of the present invention are excellent in that it is possible to prevent detachment from a printed circuit board even if the printed circuit board is deformed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board comprising:
   a laminated body including insulation layers that are made of a thermoplastic resin and are stacked on one another in a stacking direction;
   a plurality of external electrodes provided on a bottom surface of the laminated body; and
   a hard member that is provided in or on the laminated body and that has a hardness that is greater than that of the insulation layers; wherein
   the laminated body includes:
      a first flexible region; and
      a rigid region that is adjacent to the first flexible region when viewed in plan from the stacking direction;
   the rigid region is less flexible than the first flexible region;
   the rigid region includes portions of the insulation layers made of the thermoplastic resin and portions of the hard member;
   the flexible region includes portions of the insulation layers made of the thermoplastic resin;
   when viewed in plan from the stacking direction, a ratio of the hard member that occupies the rigid region to the rigid region is greater than a ratio of the hard member that occupies the first flexible region to the first flexible region;
   at least some of the plurality of external electrodes are provided within the first flexible region when viewed in plan from the stacking direction;
   the hard member includes a first film electrode;
   the rigid region includes the first film electrode when viewed in plan from the stacking direction;
   the rigid region includes a plurality of via-hole conductors connected to the first film electrode;
   the rigid region includes an element that is overlapped by the first film electrode when viewed in plan from the stacking direction; and
   the plurality of via-hole conductors are arranged to surround an outer periphery of the element.

2. The circuit board according to claim 1, wherein the first film electrode is a solid electrode.

3. The circuit board according to claim 1, wherein the first film electrode is a ground conductor or a capacitor conductor.

4. The circuit board according to claim 1,
   wherein
   the hard member further includes a second film electrode;
   the element is located between the first film electrode and the second film electrode in the stacking direction and is overlapped by the second film electrode when viewed in plan from the stacking direction.

5. The circuit board according to claim 4, wherein the plurality of via-hole conductors connect the first inner conductor to the second inner conductor.

6. The circuit board according to claim 5, wherein the plurality of via-hole conductors are provided to connect the first film electrode and the second film electrode at at least three positions that are not aligned in a line when viewed in plan from the stacking direction.

7. The circuit board according to claim 1, wherein all of the plurality of external electrodes are provided within the first flexible region when viewed in plan from the stacking direction.

8. The circuit board according to claim 1, wherein
   the plurality of external electrodes are provided along a periphery of the bottom surface, which has a rectangular or substantially rectangular shape; and external electrodes of the plurality of external electrodes located closest to corners of the bottom surface are provided within the first flexible region.

9. The circuit board according to claim 1, wherein the laminated body further includes:
   a second flexible region located on a lower side in the stacking direction than the rigid region; and
   when viewed in plan from the stacking direction, a ratio of the hard member that occupies the rigid region to the rigid region is greater than a ratio of the hard member that occupies the second flexible region to the second flexible region.

10. The circuit board according to claim 1, wherein an electronic component is mounted on an upper surface of the laminated body within the rigid region.

11. A mother laminated body comprising:
   a plurality of the circuit boards according to claim 1 arranged in a matrix; and
   a reinforcing member arranged so as to surround the plurality of circuit boards arranged in the matrix when viewed in plan from the stacking direction.

* * * * *